(12) United States Patent
Chen et al.

(10) Patent No.: US 11,328,924 B2
(45) Date of Patent: May 10, 2022

(54) SEMICONDUCTOR WAFER AND METHOD FOR MANUFACTURING SEMICONDUCTOR WAFER THEREOF

(71) Applicant: Xiamen Changelight Co. Ltd., Xiamen (CN)

(72) Inventors: Kaixuan Chen, Xiamen (CN); Zhiwei Lin, Xiamen (CN); Liyan Huo, Xiamen (CN); Xiangjing Zhuo, Xiamen (CN); Gang Yao, Xiamen (CN); Aimin Wang, Xiamen (CN)

(73) Assignee: Xiamen Changelight Co., Ltd., Xiamen (CN)

( * ) Notice: Subject to any disclaimer, the term of this patent is extended or adjusted under 35 U.S.C. 154(b) by 117 days.

(21) Appl. No.: 16/826,160

(22) Filed: Mar. 20, 2020

(65) Prior Publication Data

US 2020/0219715 A1    Jul. 9, 2020

Related U.S. Application Data

(63) Continuation-in-part of application No. 16/050,899, filed on Jul. 31, 2018, now Pat. No. 10,658,541.

(30) Foreign Application Priority Data

Sep. 30, 2017   (CN) .......................... 201710919143.6
Jun. 14, 2019   (CN) .......................... 201910516550.1

(51) Int. Cl.
*H01L 33/12*     (2010.01)
*H01L 21/02*     (2006.01)
*H01L 21/3213*   (2006.01)
*H01L 21/28*     (2006.01)

(52) U.S. Cl.
CPC .. *H01L 21/02002* (2013.01); *H01L 21/28202* (2013.01); *H01L 21/3213* (2013.01)

(58) Field of Classification Search
None
See application file for complete search history.

(56) References Cited

U.S. PATENT DOCUMENTS

2015/0280069 A1* 10/2015 Zhang ..................... H01L 33/32
                                                               257/76
2021/0175077 A1*  6/2021 Song ................. H01L 21/02381

* cited by examiner

*Primary Examiner* — Michelle Mandala
(74) *Attorney, Agent, or Firm* — Arch & Lake LLP

(57) ABSTRACT

Provided is a method for manufacturing a semiconductor wafer and a semiconductor wafer. The method includes: disposing a sacrificial layer on a first surface and a second surface of a patterned substrate, the patterned substrate comprising the first surface and the second surface having different normal directions; exposing the first surface by removing the first portion of the sacrificial layer disposed on the first surface; growing an original nitride buffer layer on the first surface and the second portion of the sacrificial layer; partially lifting off the second portion of the sacrificial layer disposed on the second surface such that at least one sub-portion of the second portion of the sacrificial layer remains on the second surface of the patterned substrate; and growing an epitaxial layer on the original nitride buffer layer, where a crystal surface of the epitaxial layer grows along a normal direction of the patterned substrate.

6 Claims, 17 Drawing Sheets

SEMICONDUCTOR WAFER AND METHOD FOR MANUFACTURING SEMICONDUCTOR WAFER THEREOF

CROSS-REFERENCE TO RELATED APPLICATIONS

This application is a continuation-in-part application which claims priority to U.S. patent application Ser. No. 16/050,899 filed Jul. 31, 2018 which claims priority of Chinese Patent Application No. 201710919143.6 filed Sep. 30, 2017. This application also claims priority to Chinese Patent Application No. 201910516550.1 filed Jun. 14, 2019. The entire disclosures of the above are incorporated herein by reference in their entireties.

FIELD

The present disclosure relates to semiconductor devices, particularly a semiconductor wafer and a method for manufacturing semiconductor wafer thereof.

BACKGROUND

This section provides background information related to the present disclosure which is not necessarily prior art.

Light-emitting diodes (LEDs) are used as semiconductor light sources. Because of various advantages such as high brightness, long product life, small footprint and low power consumption, LEDs are considered to be the choice of the illumination devices of the next generation. A goal for research and development in the LED field is to improve the luminous efficacies of the LEDs and epitaxial wafers for manufacturing LED chips.

SUMMARY

This section provides a general summary of the disclosure, and is not a comprehensive disclosure of its full scope or all of its features.

According to a first aspect of the present disclosure, a method of manufacturing semiconductor wafers includes: selectively growing a nitride buffer layer on a first surface of a patterned substrate, the patterned substrate including at least the first surface and a second surface; and growing an epitaxial layer on the nitride buffer layer. A crystal surface of the epitaxial layer grows along a normal direction of the patterned substrate. The epitaxial layer does not include multiple crystal surfaces having different crystal growth directions that cause a stress at a junction interface where the crystal surfaces having the different crystal growth directions meet.

In a second aspect of the present disclosure, the nitride buffer layer is selectively grown by a process of: disposing a sacrificial layer on the first surface and the second surface of the patterned substrate, the sacrificial layer including a first portion disposed on the first surface and a second portion disposed on the second surface; exposing the first surface by removing the first portion of the sacrificial layer disposed on the first surface; growing an original nitride buffer layer on the first surface and the second portion of the sacrificial layer; removing a top portion of the original nitride buffer layer by a first wet etching process or a dry etching process to expose a top portion of the second portion of the sacrificial layer; and lifting off the second portion of the sacrificial layer disposed on the second surface and a portion of the original nitride buffer layer disposed on the second portion of the sacrificial layer by a second wet etching process, such that the nitride buffer layer remains and is in direct contact with the first surface of the patterned substrate and no substantial nitride buffer layer remains on the second surface of the patterned substrate.

In a third aspect of the present disclosure, a semiconductor epitaxial structure includes: a patterned substrate including at least a plane surface area and a raised surface area; a nitride buffer layer disposed on the plane surface area of the patterned substrate; and a nitride epitaxial layer nucleated and grown on the nitride buffer layer. The nitride buffer layer is in direct contact with the plane surface area of the patterned substrate and no substantial nitride buffer layer is disposed on the raised surface area of the patterned substrate. As a result, the epitaxial layer does not include multiple crystal surfaces having different crystal growth directions that cause a stress at a junction interface where the crystal surfaces having the different crystal growth directions meet.

In another aspect of the present disclosure, a method for manufacturing a semiconductor wafer includes: disposing a sacrificial layer on a first surface and a second surface of a patterned substrate, the patterned substrate including the first surface and the second surface having different normal directions, wherein the sacrificial layer includes a first portion disposed on the first surface and a second portion disposed on the second surface; exposing the first surface by removing the first portion of the sacrificial layer disposed on the first surface; growing an original nitride buffer layer on the first surface and the second portion of the sacrificial layer; partially lifting off the second portion of the sacrificial layer disposed on the second surface such that at least one sub-portion of the second portion of the sacrificial layer remains on the second surface of patterned substrate; and growing an epitaxial layer on the original nitride buffer layer and the at least one sub-portion of the second portion of the sacrificial layer, wherein a crystal surface of the epitaxial layer grows along a normal direction of the patterned substrate.

In another aspect of the present disclosure, a semiconductor wafer includes: a patterned substrate including at least a first surface and a second surface having different normal directions; at least one sub-portion of a sacrificial layer grown on the second surface of the patterned substrate; a nitride buffer layer selectively-grown on the first surface of the patterned substrate; and an epitaxial layer grown on the nitride buffer layer and the at least one sub-portion of the sacrificial layer, wherein a crystal surface of the epitaxial layer grows along a normal direction of the patterned substrate.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DETAILED DESCRIPTION

An epitaxial wafer is a wafer of semiconducting material fabricated by epitaxial growth for use in manufacturing LED chips or other semiconductor chips. The epitaxial wafer includes one or more epitaxial layers that may be the same material as, or different material from a substrate of the wafer.

As an attempt to improve the crystal quality and light extraction efficacy of the epitaxial layer (e.g., LED chip wafers), a patterned substrate (e.g., patterned sapphire substrate) may be used as a substrate for epitaxial growth. A patterned substrate may be fabricated on a regular planar substrate by forming periodic pattern(s) (e.g., two-dimensional periodic patterns) on the planar substrate by photolithography and etching. Common patterns of the patterned substrate include, e.g., cone-shaped patterns, bullet-shaped patterns, hexagonal patterns, etc. In order to achieve a high-quality nitride epitaxial layer by using a metal-organic chemical vapor deposition (MOCVD) method on a substrate, typically a nitride buffer layer is deposited at a relatively low temperature, and a nitride epitaxial layer is then grown on the buffer layer at a relatively high temperature to achieve a monocrystalline layer. In some embodiments, a patterned substrate may suppress or eliminate lattice stress and/or lattice dislocations caused by release of the lattice stress. A patterned substrate may also increase light extraction efficacy by, e.g., increasing an area of total internal reflection.

Figure 1:
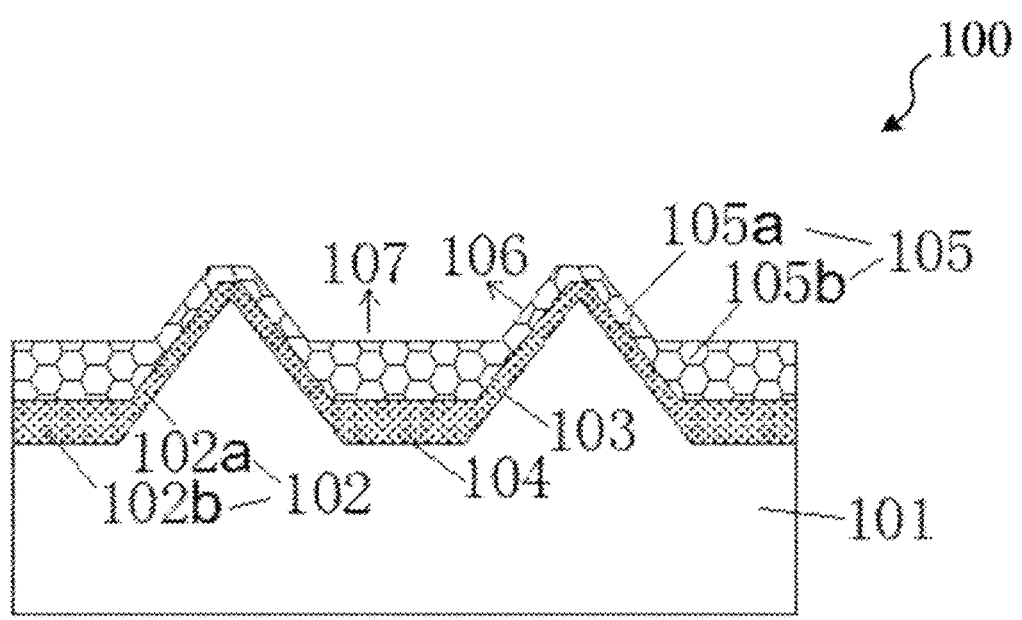
FIG. 1 schematically illustrates a cross-sectional view of an epitaxial wafer.

FIG. 1 schematically illustrates a cross-sectional view of an epitaxial wafer. The epitaxial wafer 100 includes a patterned substrate 101, a nitride buffer layer 102, and a nitride epitaxial layer 105.

As shown in FIG. 1, when the nitride buffer layer 102 is deposited on the patterned substrate 101, the nitride buffer layer 102 is simultaneously deposited on both the sidewalls 103 and the horizontal planes 104 of the patterned substrate 101. In a subsequent epitaxial growth process, the nitride epitaxial layer 105 simultaneously undergoes nucleus growth along one or more lateral directions 106 and a substrate normal direction 107, respectively based on the nitride buffer layer 102a on the sidewalls 103 and the nitride buffer layer 102b on the horizontal planes 104.

The nitride epitaxial layer 105a grown along the lateral directions 106 and the nitride epitaxial layer 105b grown along the substrate normal direction 107 meet each other at a junction interface and cause a significant stress at the interface. The stress at the interface causes the epitaxial wafer to warp, which decreases the uniformity of the epitaxial wafer. In addition, defects and dislocations may occur as a result of stress release at the junction interface, and reduce reliability of products (e.g., LED chips) made from the wafers.

According to at least some embodiments of the present disclosure, in order to solve the above-mentioned drawbacks, a selectively grown nitride buffer layer and a manufacturing method thereof are described. FIGS. 2-7 schematically illustrate various stages of a method of selectively growing a nitride buffer layer on a patterned substrate and growing an epitaxial layer on the selectively grown nitride buffer layer. In at least some embodiments, a sacrificial layer (e.g., silicon dioxide layer) is deposited on pattern sidewalls of the patterned substrate (but not on the pattern planes), before a buffer layer (e.g., nitride buffer layer) is further deposited on the sacrificial layer. The material of the sacrificial layer (e.g., hard mask materials) can be selected such that a wet etching solution can etch the material of the sacrificial layer but cannot etch the material of the buffer layer.

Two wet etching processes, respectively using two different etching solutions, can be used to remove the sacrificial layer and the buffer layer overlying the sacrificial layer via a lift-off process. As a result, the buffer layer (e.g., nitride buffer layer) overlying pattern sidewalls of the patterned substrate is removed, leaving merely the buffer layer deposited on pattern planes of the patterned substrate. A nitride epitaxial layer can further grow on the buffer layer along the normal direction of the substrate without growth along any other lateral directions.

Figure 2:
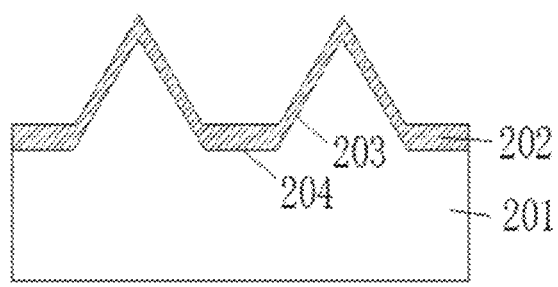
FIG. 2 schematically illustrates various stages of a method of selectively growing a nitride buffer layer on a patterned substrate.

As shown in FIG. 2, a layer of silicon dioxide 202 is uniformly deposited on a patterned substrate 201. The material of the patterned substrate 201 may be, e.g., sapphire, silicon carbide, silicon, gallium nitride, aluminum nitride, or a combination of two or more thereof. The sacrificial layer 202 (e.g. silicon dioxide) covers pattern sidewalls 203 and pattern planes 204 of the patterned substrate 201.

Figure 3:
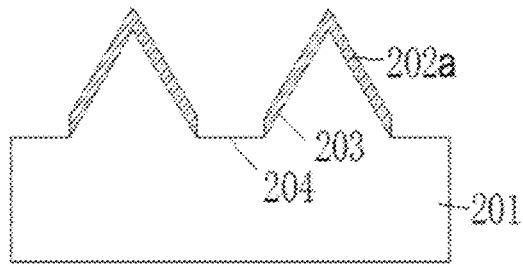
FIG. 3 schematically illustrates various stages of a method of selectively growing a nitride buffer layer on a patterned substrate.

As shown in FIG. 3, a portion of the sacrificial layer 202 overlying the pattern planes 204 is removed by, e.g., photolithography and etching, leaving a sacrificial layer 202 an overlying the pattern sidewalls 203. For example, a layer of photoresist can be disposed on the sacrificial layer 202. The photoresist overlying the pattern planes 204 are removed by, e.g., photolithography exposure. The portion of the sacrificial layer 202 overlying the pattern planes 204 can be removed by etching (e.g., wet etching). Another portion of the sacrificial layer 202 overlying the pattern sidewalls 203 are not etched away due to the remaining photoresist. Then the remaining photoresist is removed.

Figure 4:
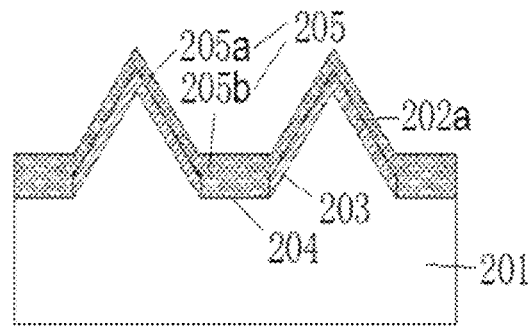
FIG. 4 schematically illustrates various stages of a method of selectively growing a nitride buffer layer on a patterned substrate.

As shown in FIG. 4, a nitride buffer layer 205 is deposited with a thickness in the range of, e.g., from about 0.5 nm to about 500 nm, or from about 1 nm to about 100 nm. A portion of the nitride buffer layer 205a is deposited on the sacrificial layer 202 an overlying the pattern sidewalls 203. Another portion of the nitride buffer layer 205b is deposited directly on the pattern planes 204.

Figure 5:
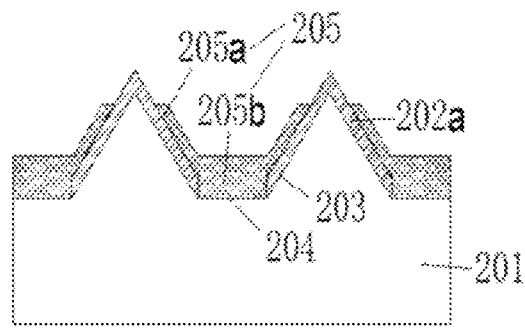
FIG. 5 schematically illustrates various stages of a method of selectively growing a nitride buffer layer on a patterned substrate.

As shown in FIG. 5, a top portion of the nitride buffer layer 205a deposited above a top portion of the patterned substrate 201 (and sacrificial layer 202a) is removed by, e.g., a first wet etching process and/or photolithography. The first wet etching process uses a first etching solution that can etch away the material of the buffer layer (e.g., nitride) but does not etch away the material of the sacrificial layer (e.g., silicon dioxide). As a result, a top portion of the sacrificial layer 202a is exposed. In some embodiments, the top portion of the sacrificial layer 202a has a diameter of less than, or equal to, about 500 nm. Alternatively, the top portion of the patterned substrate 201 can be also removed by, e.g., a dry etching process such as inductively coupled plasma (ICP) or other physical processes.

Figure 6:
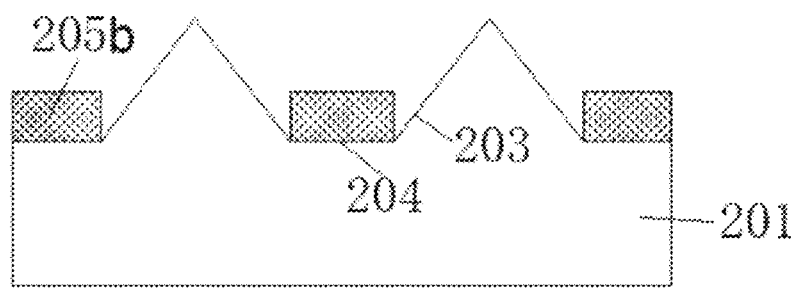
FIG. 6 schematically illustrates various stages of a method of selectively growing a nitride buffer layer on a patterned substrate.

As shown in FIG. 6, the silicon dioxide 202a covering the pattern sidewalls 203 is removed by, e.g., a second wet etching process. The second wet etching process uses a second etching solution (e.g., hydrofluoric acid) that is different from the first etching solution. The second etching solution can etch away the material of the sacrificial layer (e.g., silicon dioxide) but does not etch away the material of the buffer layer (e.g., nitride). As FIGS. 5 and 6 shows, the second etching solution flows into the space between the nitride buffer layer 205a and the sidewalls 203. Since the sacrificial layer 202a is etched away, the nitride buffer layer 205a deposited on the silicon dioxide 202a is also simultaneously removed via the lift-off process. The nitride buffer layer 205b is left in direct contact with the pattern planes 204 of the patterned substrate 201.

The disclosed approach involves two processes of wet etching and is superior over dry etching process such as inductive coupled plasma (ICP). For example, although the ICP process can also remove the nitride buffer layer on the sidewalls 203, the ICP process tends to etch away portions of the nitride buffer layer disposed on the planes 204 that are close to the borders between the sidewalls 203 and the planes 204. In contract, the disclosed approach involving two processes of wet etching can accurately remove the nitride buffer layer on the sidewalls 203 while keeps the nitride buffer layer on the planes 204.

Figure 7:
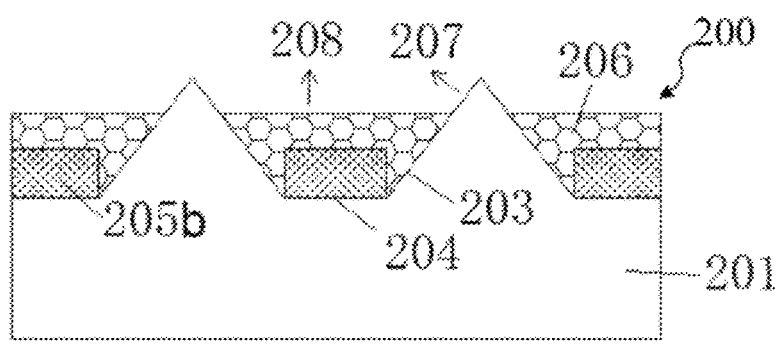
FIG. 7 schematically illustrates growing an epitaxial layer on the selectively grown nitride buffer layer.

As a result, the nitride buffer layer 205b is selectively grown on the patterned substrate 201 as shown in FIG. 6. A nitride epitaxial layer 206 may be further grown on the patterned substrate 201 using, e.g., MOCVD, to form an epitaxial structure 200. As shown in FIG. 7, because the sacrificial layer 202a previously deposited on the pattern sidewalls 203 and the nitride buffer layer 205a overlying the sacrificial layer 202a have already been removed by lift-off, there is no material on the pattern sidewalls 203 that is susceptible to nucleation and growth of the nitride epitaxial layer 206. Thus, the growth pattern of the nitride epitaxial layer 206 along the lateral directions 207 on the pattern sidewalls 203 is suppressed. That is, the crystal plane of the nitride epitaxial layer 206 does not grow along the lateral directions 207.

On the other hand, the nitride buffer layer 205b remains on the pattern planes 204. The nitride epitaxial layer 206 is efficiently nucleated and grown on the nitride buffer layer 205b, so a normal direction of the crystal plane of the nitride epitaxial layer 206 is along the substrate normal direction 208.

In some embodiments, the crystal structures of the nitride buffer layer and the nitride epitaxial layer are different. The nitride buffer layer (e.g., gallium nitride or aluminum nitride) is grown at a relatively low temperature (e.g., about 500 degrees Celsius). As a result, the nitride buffer layer is not a monocrystalline layer. In other words, the crystal phases of the buffer layer (at least the bottom portion of the buffer layer) are random. In contrast, the nitride epitaxial layer is grown at a relatively high temperature (e.g., about 1000 degrees Celsius). As a result, the nitride buffer layer is a monocrystalline layer. In some other embodiments, the materials of the buffer layer and the epitaxial layer are different.

Therefore, using the selectively grown nitride buffer layer and the manufacturing method thereof as disclosed, the crystal surface of the nitride epitaxial layer can grow along the normal direction of the substrate without growth along the lateral directions, thereby avoiding the situation that crystal surfaces grown along multiple different directions and meet at a junction interface causing a significant stress. The disclosed technology suppresses the warpage of the epitaxial wafer and improves the uniformity of the epitaxial wafer. In addition, the disclosed technology reduces or eliminates defects and dislocations at the interface between the crystal planes, improving the reliability of products manufacturing using the epitaxial wafer. The epitaxial wafer can be used to manufacture, e.g., LED chips.

Figure 8:
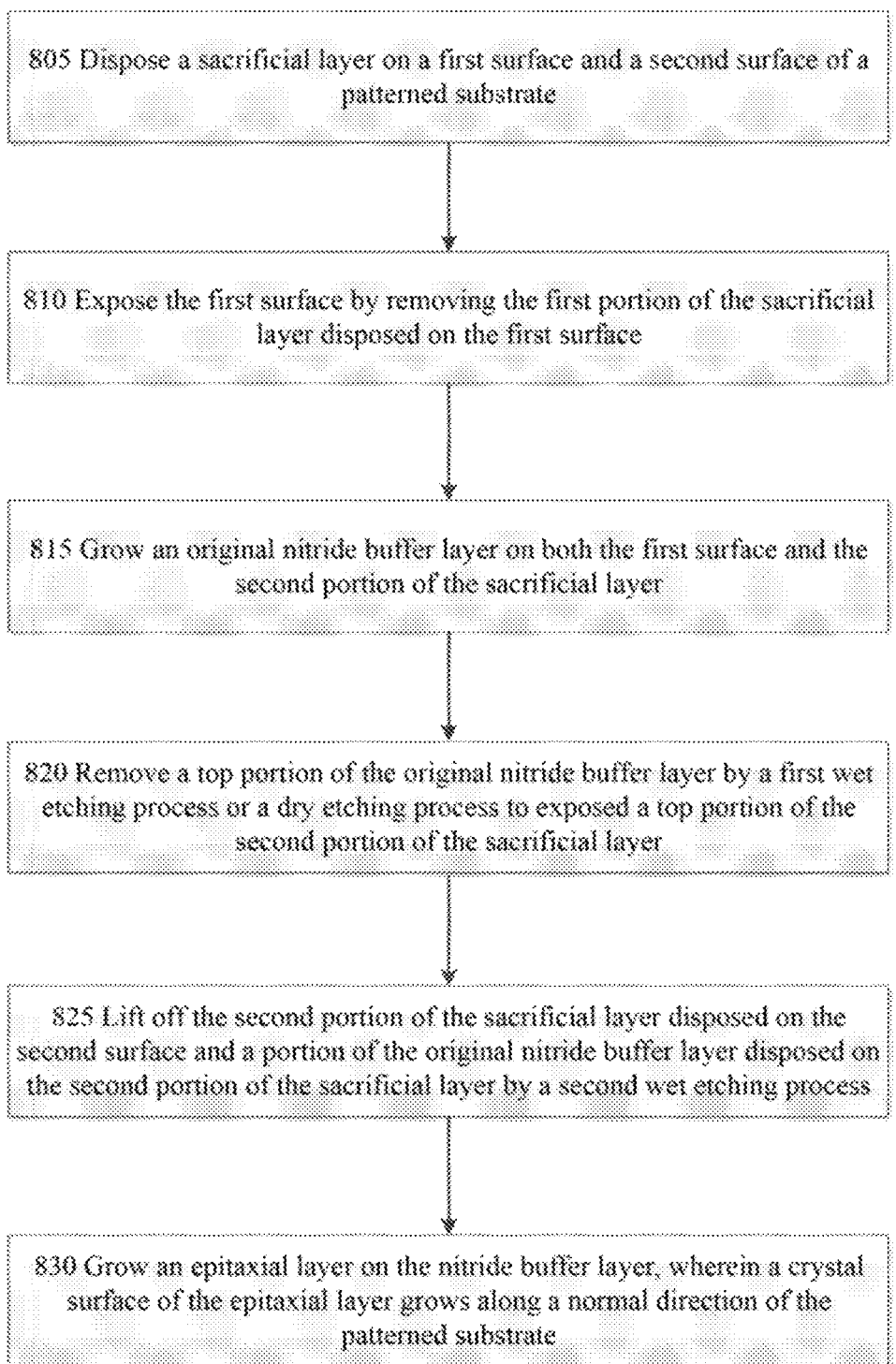
FIG. 8 schematically illustrates a flow chart of a method of selectively growing a nitride buffer layer on a patterned substrate and growing an epitaxial layer on the selectively grown nitride buffer layer.

FIG. 8 schematically illustrates a flow chart of a method of selectively growing a nitride buffer layer on a patterned substrate and growing an epitaxial layer on the selectively grown nitride buffer layer. The patterned substrate includes periodic patterns of a first surface and a second surface, and normal directions of the first surface and the second surface are different. The first surface may be, e.g., a plane surface area that is substantially parallel to the patterned substrate. The second surface may be, e.g., a raised surface area including one or more sidewalls having lateral normal directions that are deviated from a normal direction of the patterned substrate.

At step 805 of the process 800, the method disposes a sacrificial layer on the first surface and the second surface of the patterned substrate, the sacrificial layer including a first portion disposed on the first surface and a second portion disposed on the second surface.

At step 810, the method exposes the first surface by removing the first portion of the sacrificial layer disposed on the first surface. For example, the first portion of the sacrificial layer can be removed by photolithography and etching as disclosed above.

At step 815, the method grows an original nitride buffer layer on both the first surface and the second portion of the sacrificial layer.

At step 820, the method removes a top portion of the original nitride buffer layer by a first wet etching process or a dry etching process to expose a top portion of the second portion of the sacrificial layer (as shown in FIG. 5). In some embodiments, the top portion of the original nitride buffer layer being removed has a diameter of less than or equal to about 500 nm.

At step 825, the method lifts off the second portion of the sacrificial layer disposed on the second surface and a portion of the original nitride buffer layer disposed on the second portion of the sacrificial layer by a second wet etching process, such that the nitride buffer layer remains and is in direct contact with the first surface of the patterned substrate and no nitride buffer layer remains on the second surface of the patterned substrate. In some embodiments, the second wet etching process uses a second chemical that etches a material of the sacrificial layer but does not etch a nitride material of the original nitride buffer layer. The second wet etching process etches away the second portion of the sacrificial layer underneath the portion of the original nitride buffer layer, such that the portion of the original nitride buffer layer is lifted off along with the second portion of the sacrificial layer.

At step 830, the method grows an epitaxial layer on the nitride buffer layer, wherein a crystal surface of the epitaxial layer grows along a normal direction of the patterned substrate. The epitaxial layer does not include multiple crystal surfaces having different crystal growth directions that cause a stress at a junction interface where the crystal surfaces having the different crystal growth directions meet.

Although various examples described and illustrated herein disclose that various layers include semiconductor materials (undoped, N-doped, or P-doped semiconductors), it is to be understood that the technology disclosed herein may be applied to chips including various types of semiconductor materials, such as gallium nitride (GaN) and/or aluminum nitride (AlN), indium nitride (InN), gallium arsenide (GaAs), aluminum arsenide (AlAs), indium arsenide (InAs), aluminum phosphide (AlP), gallium phosphide (GaP), indium phosphide (InP), aluminum antimonide (AlSb), gallium antimonide (GaSb), indium antimonide (InSb), or any compound or alloy thereof (e.g., AlGaN, GaInN, AlInN, AlGaInN, AlGaAs, GaInAs, AlInAs, AlGaInAs, AlInP, GaInP, AlGaInP, AlInSb, GaInSb, AlGaSb, AlGaInSb, etc.). In other words, the semiconductor material may be formed of, or at least include, e.g., a nitride compound, an alloy of nitride compounds, an arsenide compound, an alloy of arsenide compounds, a phosphide compound, an alloy of phosphide compounds, an antimonide compound, an alloy of antimonide compounds, a ternary alloy of group III elements and group V elements, or a quaternary alloy of group III elements and group V elements.

In some examples, when lifting off the sacrificial layer, some of the sacrificial layer are remained on the pattern sidewalls. In these examples, the remaining parts of the sacrificial layer on the pattern sidewalls may provide a refractive index different than the nitride buffer layer, thereby improving the external quantum efficiency of LED by reducing total reflection.

Figure 9:
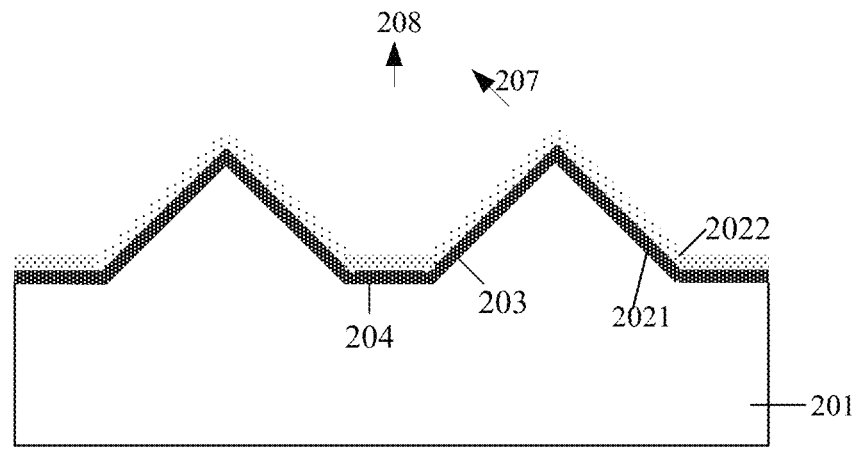
FIGS. 9-14 schematically illustrate various stages of a method for manufacturing a semiconductor wafer according to some embodiments.

FIGS. 9-14 schematically illustrate various stages of a method for manufacturing a semiconductor wafer according to some embodiments. As shown in FIG. 9, two sacrificial layers 2021 and 2022 are uniformly deposited on a patterned substrate 201. The material of the patterned substrate 201 may be, e.g., sapphire, silicon carbide, silicon, gallium nitride, or aluminum nitride. The sacrificial layer 2021 (e.g., silicon dioxide) is disposed on pattern sidewalls 203 and pattern planes 204 of the patterned substrate 201. The sacrificial layer 2022 is then disposed on the sacrificial layer 2021. The sacrificial layer 2022 covers the portion of the sacrificial layer 2021 disposed on the pattern sidewalls 203 and the portion of the sacrificial layer 2021 disposed on the pattern planes 204.

Figure 10:
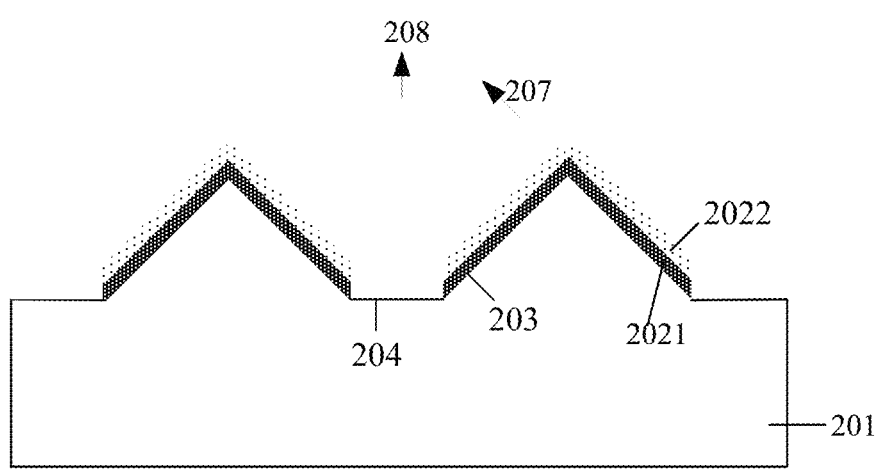

As shown in FIG. 10, the portion of the sacrificial layer 2021 and the portion of the sacrificial layer 2022 overlying the pattern planes 204 are removed by, e.g., photolithography and etching, leaving the portion of the sacrificial layer 2021 and the portion of the sacrificial layer 2022 overlying the pattern sidewalls 203. For example, a layer of photoresist may be disposed on the sacrificial layer 2022. The photoresist overlying the pattern planes 204 is removed by, e.g., photolithography exposure. The portion of the sacrificial layer 2021 and the portion of the sacrificial layer 2022 overlying the pattern planes 204 may be removed by etching (e.g., wet etching). Another portion of the sacrificial layer 2021 and the portion of the sacrificial layer 2022 overlying the pattern sidewalls 203 are not etched away due to the remaining photoresist. Then the remaining photoresist is removed.

Figure 11:
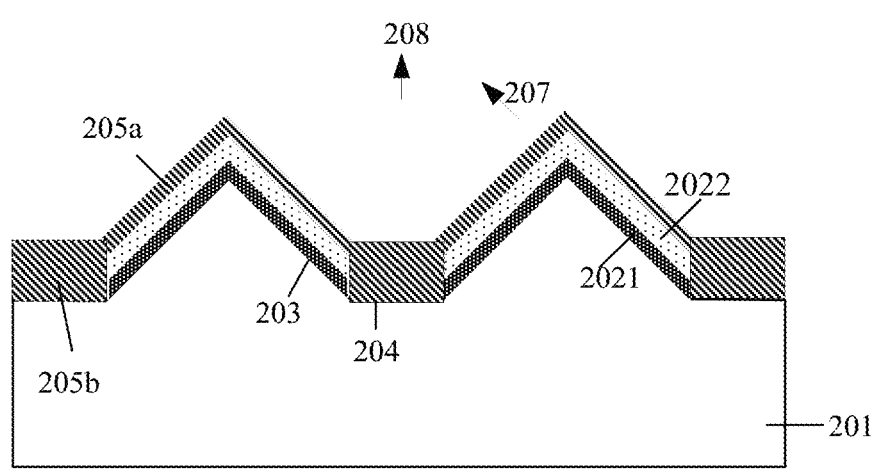

As shown in FIG. 11, a nitride buffer layer is deposited with a thickness in the range of, e.g., from about 0.5 nm to about 500 nm, or from about 1 nm to about 100 nm. A portion of the nitride buffer layer 205a is deposited on the sacrificial layer 2022 overlying the pattern sidewalls 203. Another portion of the nitride buffer layer 205b is deposited directly on the pattern planes 204.

Figure 12:
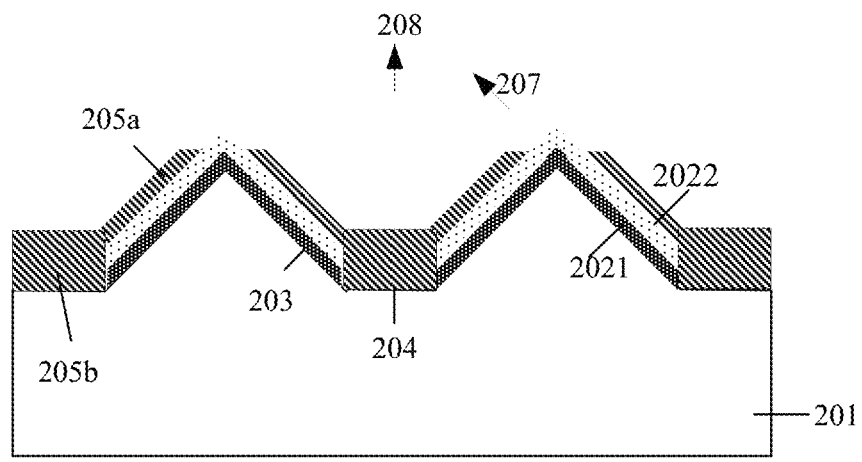

As shown in FIG. 12, a top portion of the nitride buffer layer 205a deposited above a top portion of the patterned substrate 201 (and the sacrificial layers 2021 and 2022) is removed by, e.g., a first wet etching process and/or photolithography. The first wet etching process uses a first etching solution that can etch away the material of the buffer layer (e.g., nitride) but does not etch away the material of the sacrificial layer (e.g., ITO, silicon dioxide). As a result, a top portion of the sacrificial layer 2022 is exposed.

Figure 13:
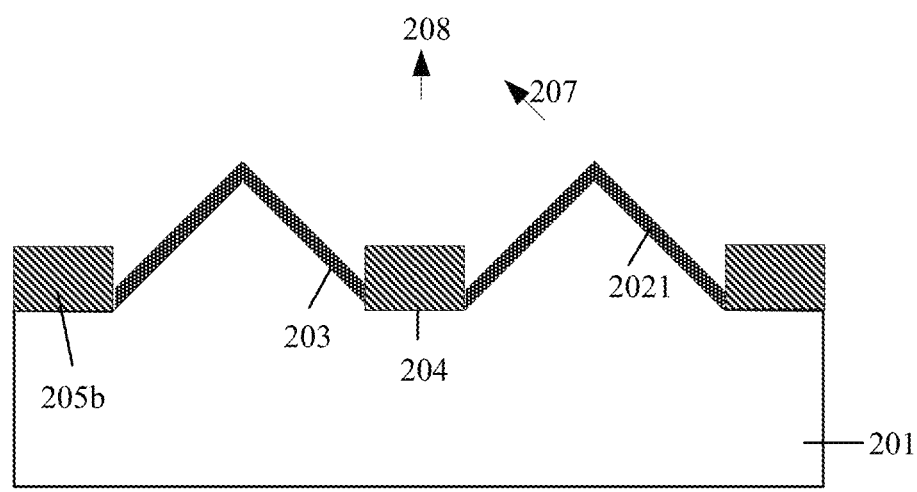

As shown in FIG. 13, the sacrificial layer 2022 overlying the pattern sidewalls 203 is removed by, e.g., a second wet etching process. The second wet etching process uses a second etching solution (e.g., hydrofluoric acid) that is different from the first etching solution. The second etching solution can etch away the material of the sacrificial layer 2022 (e.g., ITO) but does not etch away the material of the buffer layer (e.g., nitride) or the material of the sacrificial layer 2021. The second etching solution flows into the space between the nitride buffer layer 205a and the sacrificial layer 2021 (or the photoresist on the sacrificial layer 2021). Since the sacrificial layer 2022 is etched away, the nitride buffer layer 205a deposited on the sacrificial layer 2022 is also simultaneously removed via the lift-off process. The material of the sacrificial layer 2022 may be ITO and the material of the sacrificial layer 2021 may be silicon dioxide.

As a result, as shown in FIG. 13, the sacrificial layer 2021 is left on the pattern sidewalls of the substrate. The material of the sacrificial layer 2021 may be silicon dioxide. The remaining sacrificial layer on the pattern sidewalls may provide a refractive index different than the nitride buffer layer, thereby improving the external quantum efficiency of LED by reducing total reflection.

Figure 14:
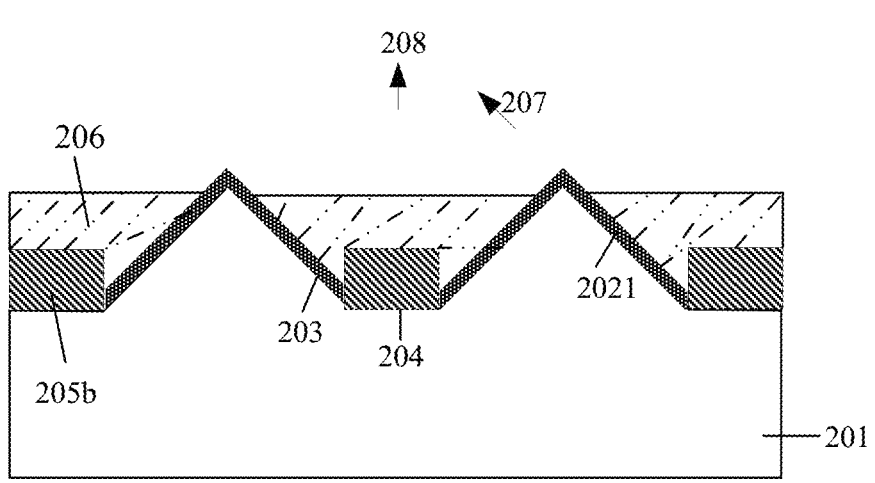

As shown in FIG. 14, a nitride epitaxial layer 206 may be further grown on the patterned substrate 201 using, e.g., MOCVD, to form an epitaxial structure.

Figure 15:
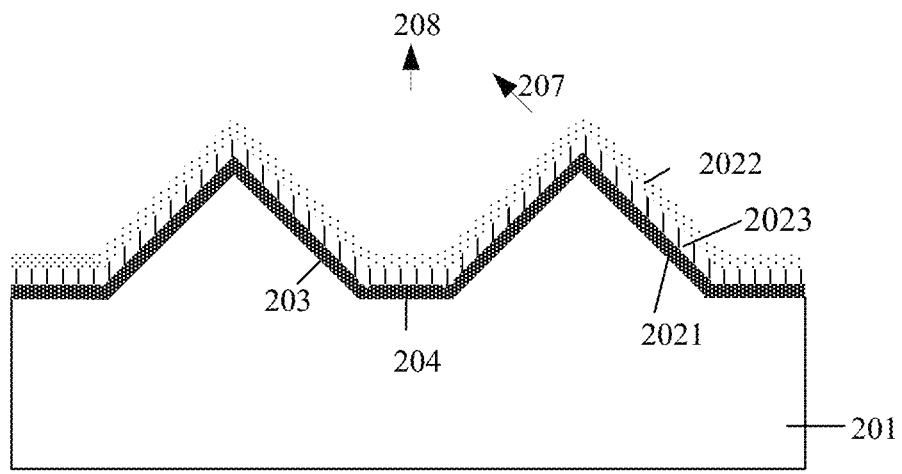
FIGS. 15-20 schematically illustrate various stages of a method for manufacturing a semiconductor wafer according to some embodiments.

In some embodiments, the remaining sacrificial layer may include multiple layers or sub-layers. As shown in FIG. 15, three sacrificial layers 2021, 2023 and 2022 are uniformly deposited on a patterned substrate 201. The material of the patterned substrate 201 may be, e.g., sapphire, silicon carbide, silicon, gallium nitride, or aluminum nitride. The sacrificial layer 2021 (e.g., silicon dioxide) is disposed on pattern sidewalls 203 and pattern planes 204 of the patterned substrate 201. The sacrificial layer 2023 is then disposed on the sacrificial layer 2021. The sacrificial layer 2023 covers the portion of the sacrificial layer 2021 disposed on the pattern sidewalls 203 and the portion of the sacrificial layer 2021 disposed on the pattern planes 204. The sacrificial layer 2022 is then disposed on the sacrificial layer 2023. The sacrificial layer 2022 covers the portion of the sacrificial layer 2023 overlying the pattern sidewalls 203 and the portion of the sacrificial layer 2021 overlying the pattern planes 204.

Figure 16:
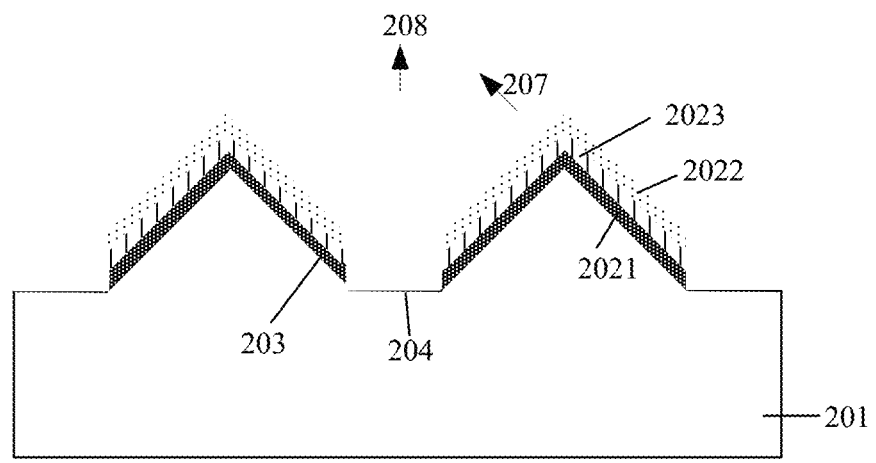

As shown in FIG. 16, the portion of the sacrificial layers 2021, 2023, and 2022 overlying the pattern planes 204 are removed by, e.g., photolithography and etching, leaving the portion of the sacrificial layers 2021, 2023, and 2022 overlying the pattern sidewalls 203. For example, a layer of photoresist may be disposed on the sacrificial layer 2022. The photoresist overlying the pattern planes 204 is removed by, e.g., photolithography exposure. The portions of the sacrificial layers 2021, 2023, and 2022 overlying the pattern planes 204 may be removed by etching (e.g., wet etching). Other portions of the sacrificial layers 2021, 2023, and 2022 overlying the pattern sidewalls 203 are not etched away due to the remaining photoresist. Then the remaining photoresist is removed.

Figure 17:
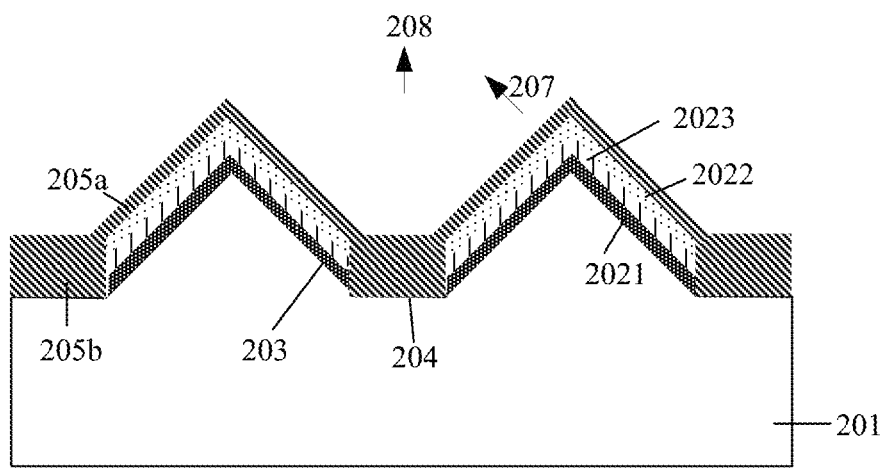

As shown in FIG. 17, a nitride buffer layer is then deposited with a thickness in the range of, e.g., from about 0.5 nm to about 500 nm, or from about 1 nm to about 100 nm. A portion of the nitride buffer layer 205a is deposited on the sacrificial layer 2022 overlying the pattern sidewalls 203. Another portion of the nitride buffer layer 205b is deposited directly on the pattern planes 204.

Figure 18:
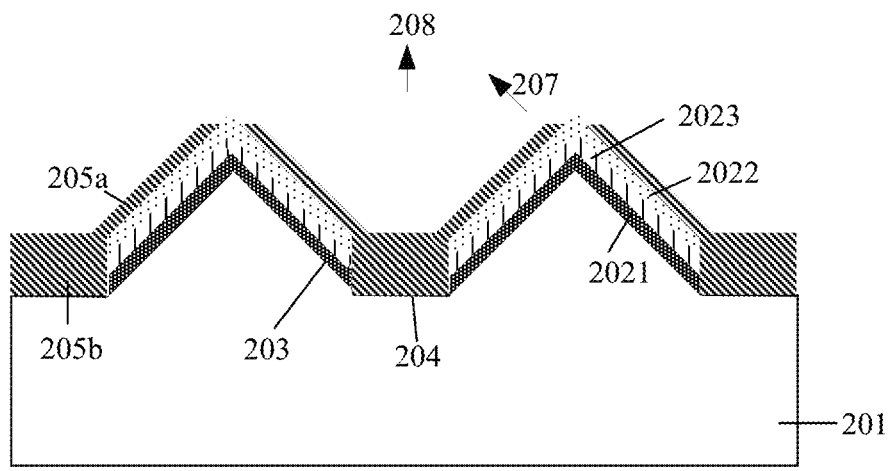

As shown in FIG. 18, a top portion of the nitride buffer layer 205a deposited above a top portion of the patterned substrate 201 (and the sacrificial layers 2021, 2023, and 2022) is removed by, e.g., a first wet etching process and/or photolithography. The first wet etching process uses a first etching solution that can etch away the material of the buffer layer (e.g., nitride) but does not etch away the material of the sacrificial layer (e.g., ITO, silicon dioxide). As a result, a top portion of the sacrificial layer 2022 is exposed.

Figure 19:
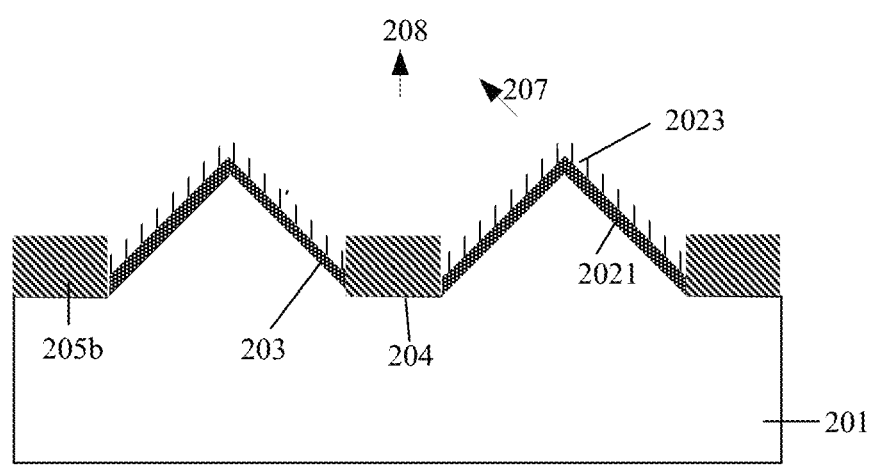

As shown in FIG. 19, the sacrificial layer 2022 overlying the pattern sidewalls 203 is removed by, e.g., a second wet etching process. The second wet etching process uses a second etching solution (e.g., hydrofluoric acid) that is different from the first etching solution. The second etching solution can etch away the material of the sacrificial layer 2022 (e.g., ITO) but does not etch away the material of the buffer layer (e.g., nitride) or the material of the sacrificial layer 2023. The second etching solution flows into the space between the nitride buffer layer 205a and the sacrificial layer 2023. Since the sacrificial layer 2022 is etched away, the nitride buffer layer 205a deposited on the silicon dioxide 2022 is also simultaneously removed via the lift-off process.

As a result, the sacrificial layers 2021 and 2023 are left on the pattern sidewalls 203 of the substrate 201. The material of the sacrificial layer 2023 or 2021 may be silicon dioxide. The remaining sacrificial layers, e.g., silicon dioxide, on the pattern sidewalls may provide a refractive index different than the nitride buffer layer, thereby improving the external quantum efficiency of LED by reducing total reflection.

Figure 20:
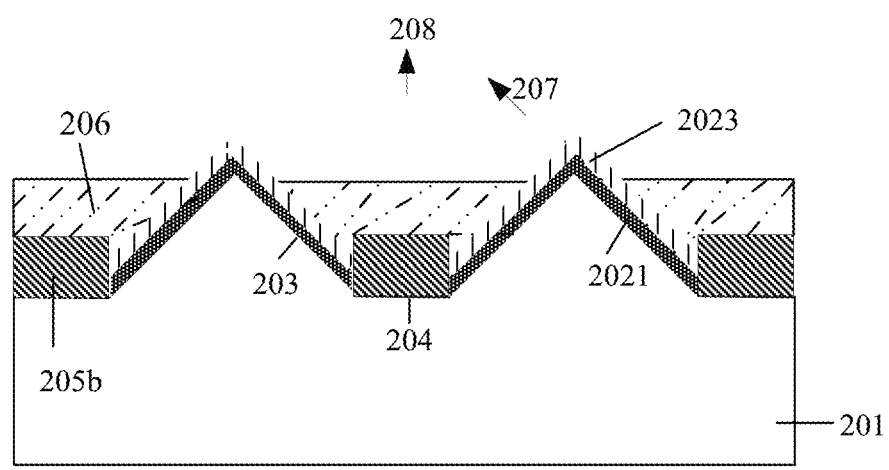

As shown in FIG. 20, a nitride epitaxial layer 206 may be further grown on the patterned substrate 201 using, e.g., MOCVD, to form an epitaxial structure.

Figure 21:
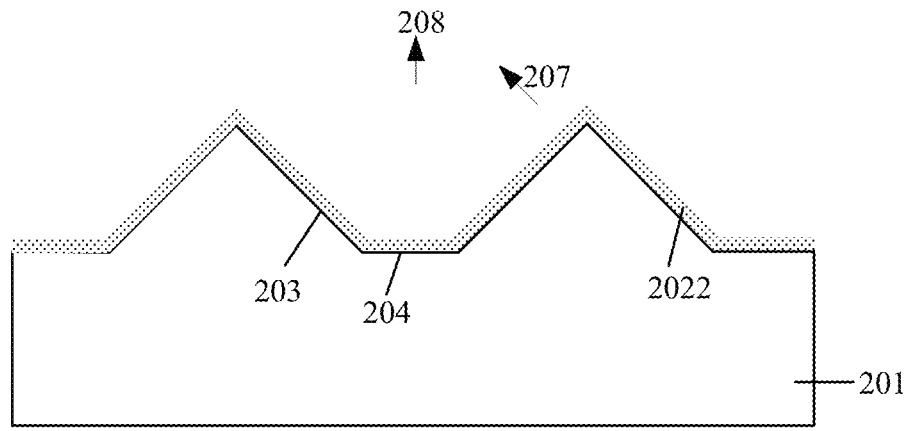
FIGS. 21-28 schematically illustrate various stages of a method for manufacturing a semiconductor wafer according to some embodiments.

As shown in FIG. 21, a sacrificial layer 2022 is first uniformly deposited on a patterned substrate 201. The material of the patterned substrate 201 may be, e.g., sapphire, silicon carbide, silicon, gallium nitride, or aluminum nitride. The sacrificial layer 2022 (e.g., ITO) is disposed on the pattern sidewalls 203 and pattern planes 204 of the patterned substrate 201.

Figure 22:
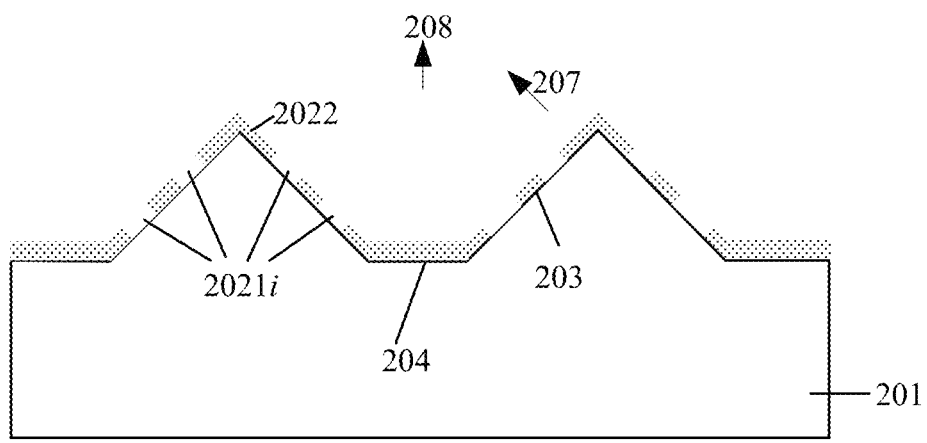
Figure 23:
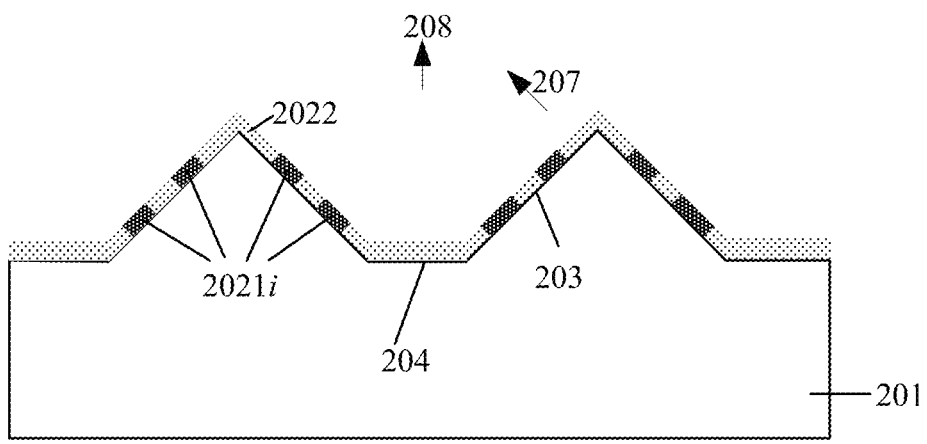

As shown in FIG. 22, some small holes (openings) 2021i are created in the sacrificial layer 2022, such that the substrate 201 is partially exposed through these small holes (openings) 2021i. And then, as shown in FIG. 23, a different sacrificial layer material is filled in these holes (openings) 2021i. For example, the material of the sacrificial layer 2022 is ITO, and the material later filled in these holes (openings) 2021i is silicon dioxide.

Figure 24:
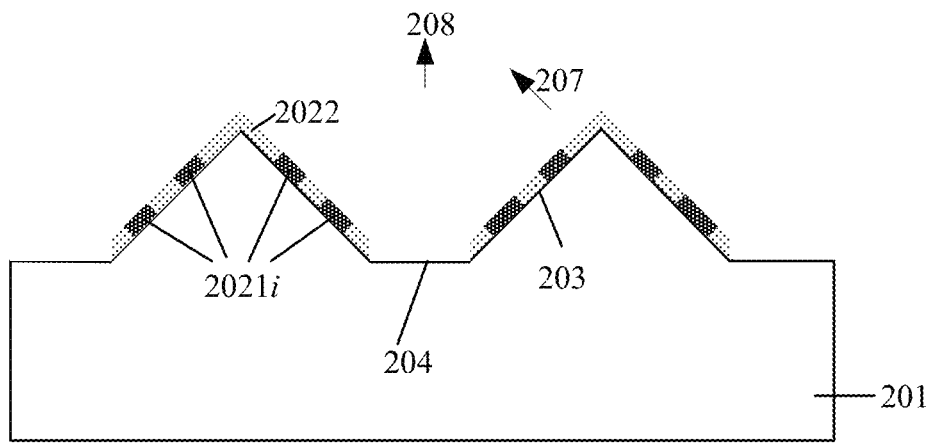

As shown in FIG. 24, the portion of the sacrificial layers 2022 overlying the pattern planes 204 is removed by, e.g., photolithography and etching, leaving the portion of the sacrificial layer 2022 and those small openings 2021i overlying the pattern sidewalls 203. For example, a layer of photoresist may be disposed on the sacrificial layer 2022. The photoresist overlying the pattern planes 204 is removed by, e.g., photolithography exposure. The portion of the sacrificial layer 2022 overlying the pattern planes 204 may be removed by etching (e.g., wet etching). Another portion of the sacrificial layer 2022 overlying the pattern sidewalls 203 is not etched away due to the remaining photoresist. Then the remaining photoresist is removed.

Figure 25:
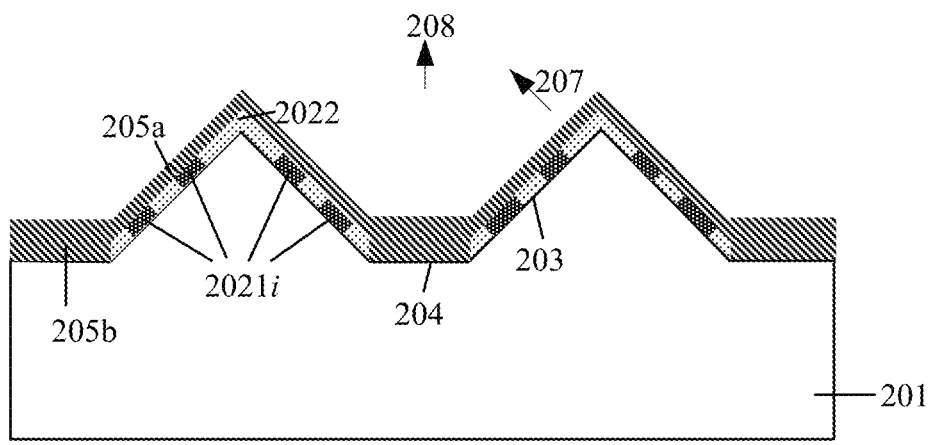

As shown in FIG. 25, a nitride buffer layer is deposited with a thickness in the range of, e.g., from about 0.5 nm to about 500 nm, or from about 1 nm to about 100 nm. A portion of the nitride buffer layer 205a is deposited on the sacrificial layer 2022 overlying the pattern sidewalls 203. Another portion of the nitride buffer layer 205b is deposited directly on the pattern planes 204.

Figure 26:
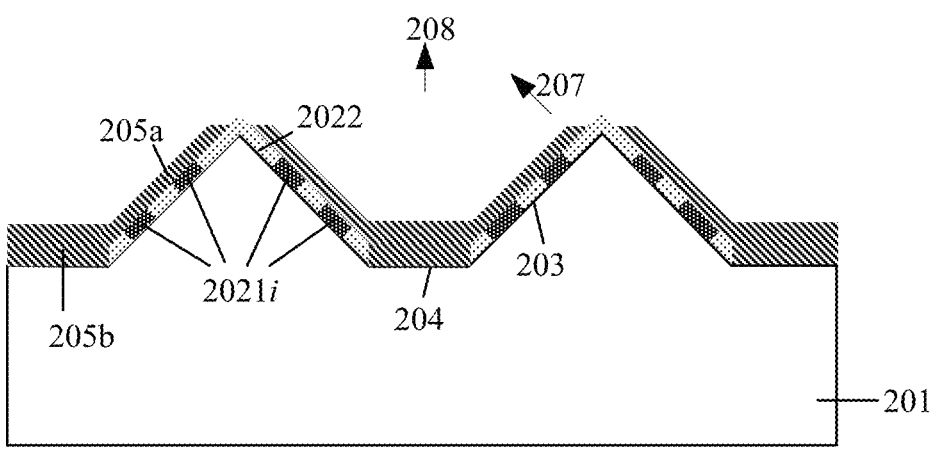

As shown in FIG. 26, a top portion of the nitride buffer layer 205a deposited above a top portion of the patterned substrate 201 (and the sacrificial layer 2022) is removed by, e.g., a first wet etching process and/or photolithography. The first wet etching process uses a first etching solution that can etch away the material of the buffer layer (e.g., nitride) but does not etch away the material of the sacrificial layer (e.g., ITO, silicon dioxide). As a result, a top portion of the sacrificial layer 2022 is exposed.

Figure 27:
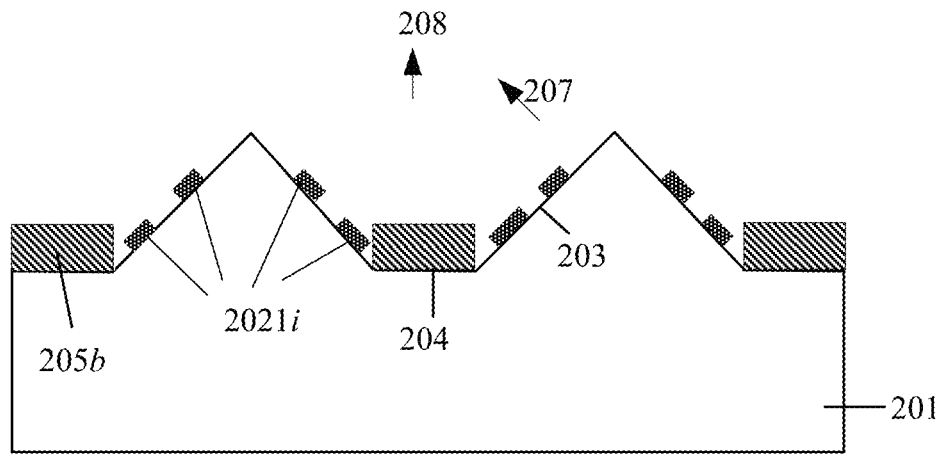

As shown in FIG. 27, the sacrificial layer 2022 covering the pattern sidewalls 203 is removed by, e.g., a second wet etching process. The second wet etching process uses a second etching solution that is different from the first etching solution. The second etching solution can etch away the material of the sacrificial layer 2022 (e.g., ITO) but does not etch away the material of the buffer layer (e.g., nitride) or the material of the small holes 2021i. The second etching solution flows into the space between the nitride buffer layer 205a and the substrate 201. Since the sacrificial layer 2022 is etched away, the nitride buffer layer 205a deposited on the sacrificial layer 2022 is also simultaneously removed via the lift-off process. In some embodiments, the small holes (openings) 2021i are remained by using photoresist. A layer of photoresist may be disposed on small holes (openings) 2021i while the photoresist covering the sacrificial layer 2022 is removed by, e.g., photolithography exposure. The second wet etching process etch away the material of the sacrificial layer 2022 (e.g., ITO) but does not etch away the material of the buffer layer (e.g., nitride) or the material of the small holes 2021i.

As a result, as shown in FIG. 27, the small holes (openings) 2021i are left on the pattern sidewalls of the substrate. The material of the small holes (openings) 2021i may be silicon dioxide. The remaining parts of a sacrificial layer on the pattern sidewalls may provide a refractive index different than the nitride buffer layer, thereby improving the external quantum efficiency of LED by reducing total reflection.

Figure 28:
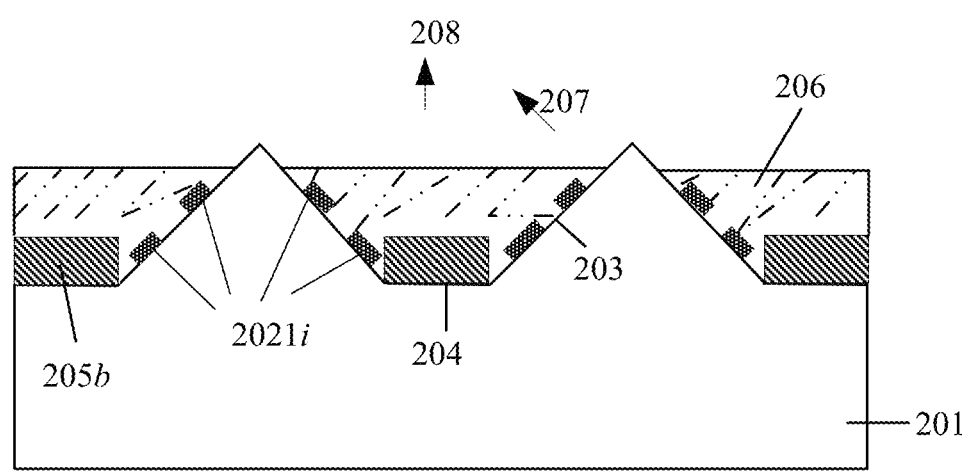

As shown in FIG. 28, a nitride epitaxial layer 206 may be further grown on the patterned substrate 201 using, e.g., MOCVD, to form an epitaxial structure.

Figure 29:
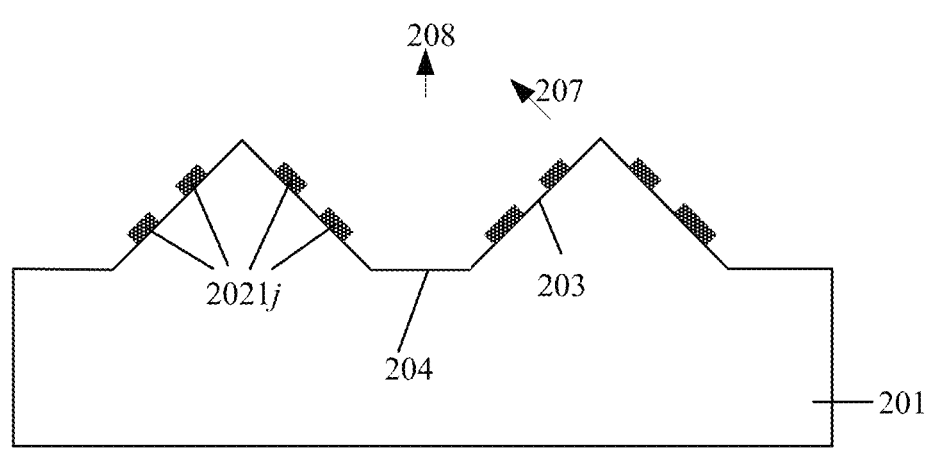
FIGS. 29-35 schematically illustrate various stages of a method for manufacturing a semiconductor wafer according to some embodiments.

FIGS. 29-35 schematically illustrate various stages of a method for manufacturing a semiconductor wafer according to another embodiment. As shown in FIG. 29, a sacrificial layer is first uniformly deposited on a patterned substrate 201. The material of the patterned substrate 201 may be, e.g., sapphire, silicon carbide, silicon, gallium nitride, or aluminum nitride. The sacrificial layer (e.g., silicon dioxide) is disposed on the pattern sidewalls 203 and pattern planes 204 of the patterned substrate 201. After the process of photolithography and etching, some portions 2021j of the sacrificial layer are left on the pattern sidewalls 203 of the patterned substrate 201, as shown in FIG. 29.

Figure 30:
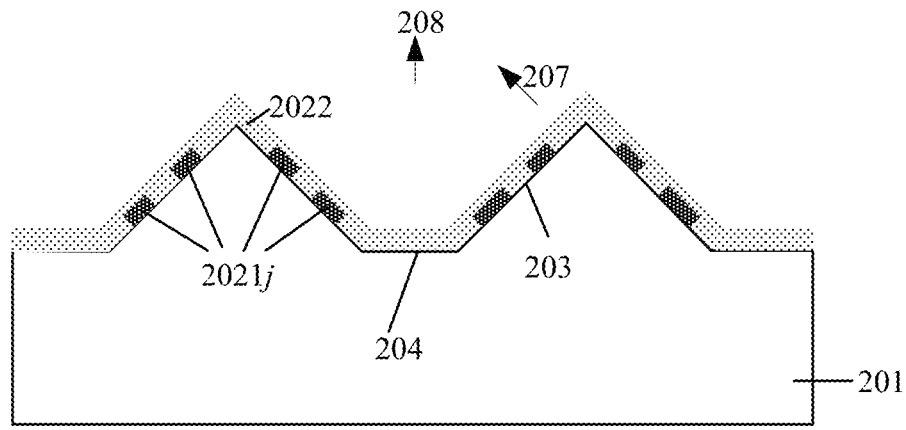

Another sacrificial layer 2022, as shown in FIG. 30, is then deposited on the pattern planes 204, parts of the patterned sidewalls 203 and the remaining portions 2021j. The material of the sacrificial layer 2022 may be ITO.

Figure 31:
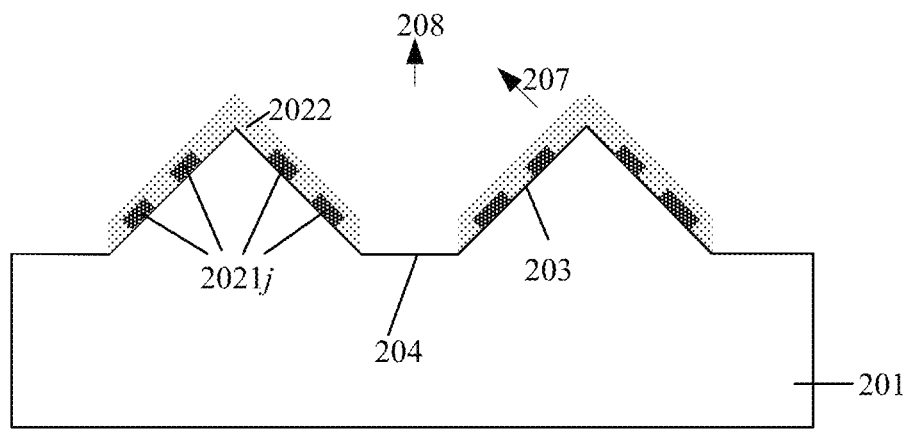

As shown in FIG. 31, the portion of the sacrificial layers 2022 overlying the pattern planes 204 is removed by, e.g., photolithography and etching, leaving the portion of the sacrificial layer 2022 overlying the pattern sidewalls 203. For example, a layer of photoresist may be disposed on the sacrificial layer 2022. The photoresist overlying the pattern planes 204 is removed by, e.g., photolithography exposure. The portion of the sacrificial layer 2022 overlying the pattern planes 204 may be removed by etching (e.g., wet etching). Another portion of the sacrificial layer 2022 overlying the pattern sidewalls 203 is not etched away due to the remaining photoresist. Then the remaining photoresist is removed.

Figure 32:
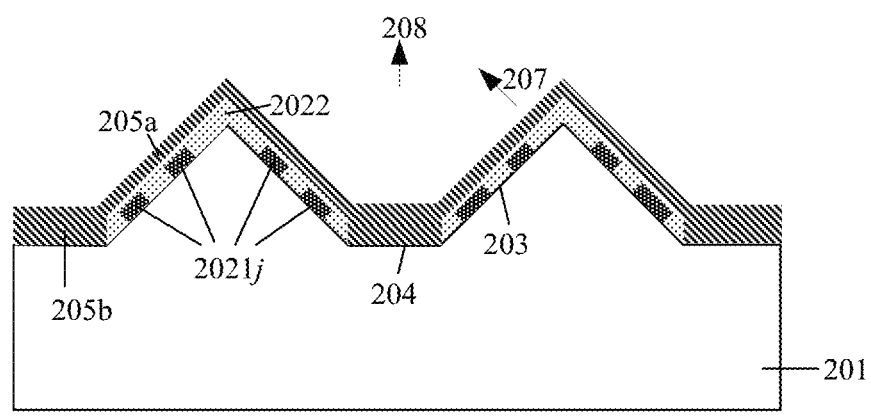

As shown in FIG. 32, a nitride buffer layer is deposited with a thickness in the range of, e.g., from about 0.5 nm to about 500 nm, or from about 1 nm to about 100 nm. A portion of the nitride buffer layer 205a is deposited on the sacrificial layer 2022 overlying the pattern sidewalls 203. Another portion of the nitride buffer layer 205b is deposited directly on the pattern planes 204.

Figure 33:
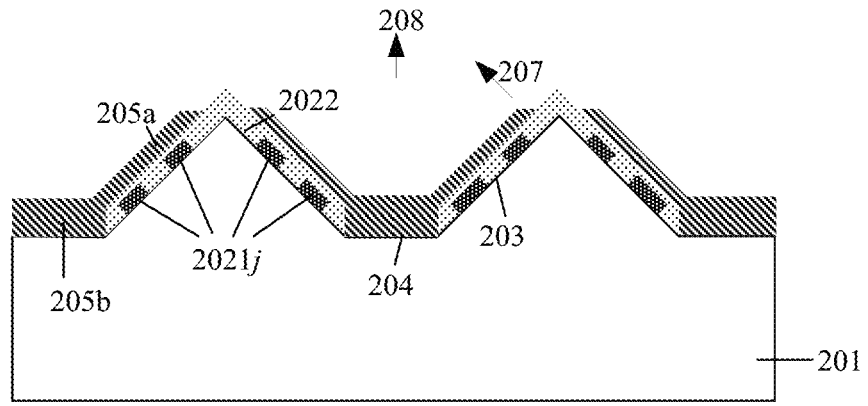

As shown in FIG. 33, a top portion of the nitride buffer layer 205a deposited above a top portion of the patterned substrate 201 (and the sacrificial layer 2022) is removed by, e.g., a first wet etching process and/or photolithography. The first wet etching process uses a first etching solution that can etch away the material of the buffer layer (e.g., nitride) but does not etch away the material of the sacrificial layer (e.g., ITO, silicon dioxide). As a result, a top portion of the sacrificial layer 2022 is exposed.

Figure 34:
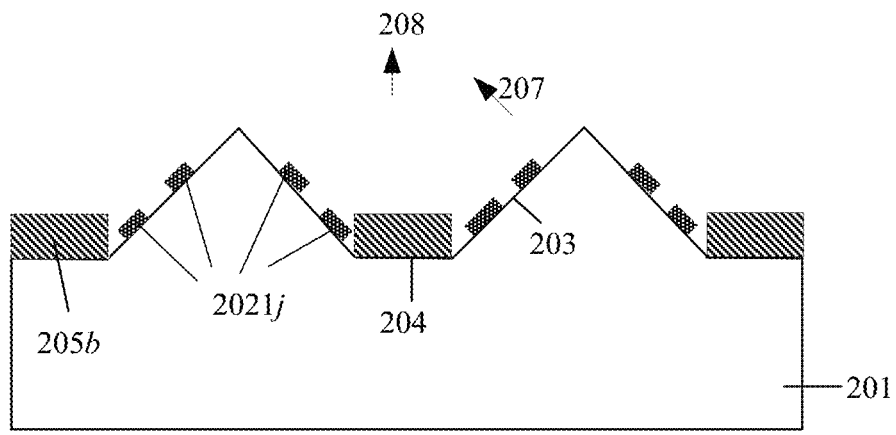

As shown in FIG. 34, the sacrificial layer 2022 covering the pattern sidewalls 203 is removed by, e.g., a second wet etching process. The second wet etching process uses a second etching solution that is different from the first etching solution. The second etching solution can etch away the material of the sacrificial layer 2022 (e.g., ITO) but does not etch away the material of the buffer layer (e.g., nitride) and the material of the remaining portions 2021j (e.g., silicon dioxide). The second etching solution flows into the space between the nitride buffer layer 205a and the substrate 201. Since the sacrificial layer 2022 is etched away, the nitride buffer layer 205a deposited on the sacrificial layer 2022 is also simultaneously removed via the lift-off process. In some embodiments, the remaining portions 2021j are remained by using photoresist. A layer of photoresist may be disposed on remaining portions 2021j while the photoresist covering the sacrificial layer 2022 is removed by, e.g., photolithography exposure. The second wet etching process etch away the material of the sacrificial layer 2022 (e.g., ITO) but does not etch away the material of the buffer layer (e.g., nitride) and the material of remaining portions 2021j.

Figure 35:
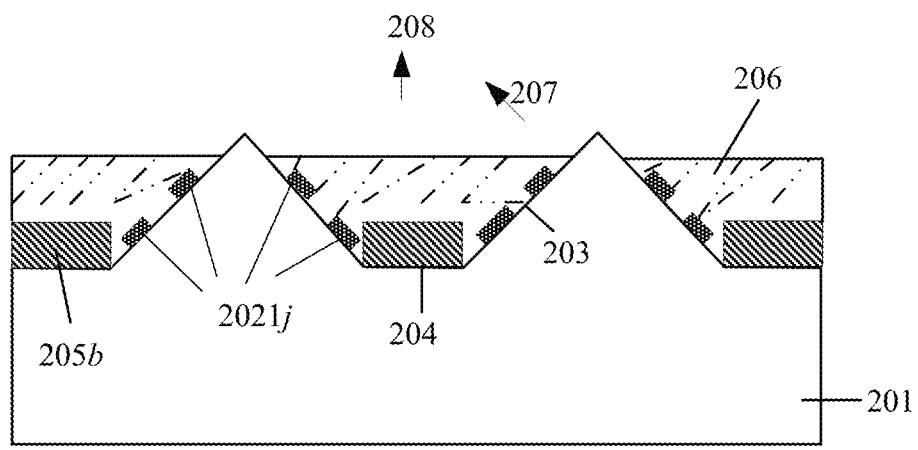

As shown in FIG. 35, a nitride epitaxial layer 206 may be further grown on the patterned substrate 201 using, e.g., MOCVD, to form an epitaxial structure.

Figure 36:
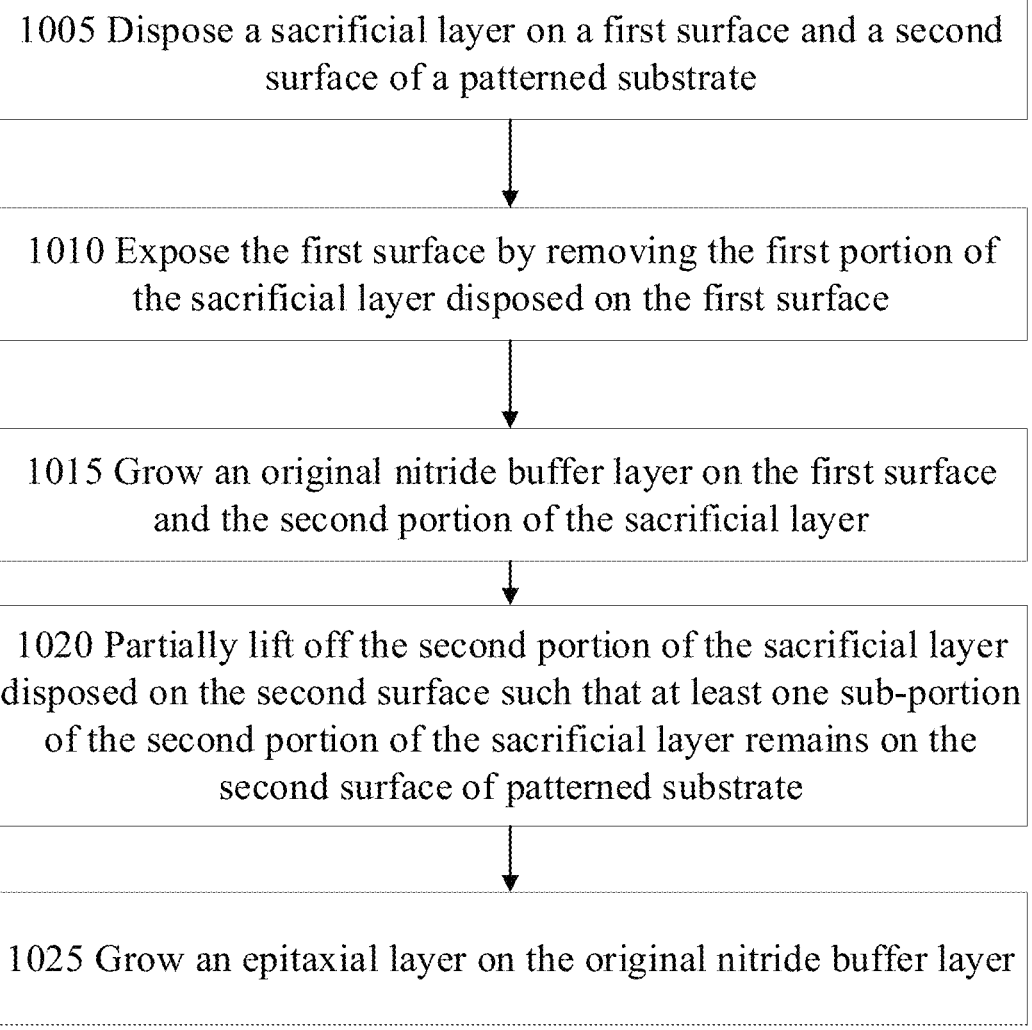
FIG. 36 illustrates a flow chart of a method for manufacturing a semiconductor wafer.

FIG. 36 illustrates a flow chart of a method for manufacturing a semiconductor wafer with remaining sub-portions of a silicon dioxide layer. At step 1005, the method disposes a sacrificial layer on a first surface and a second surface of a patterned substrate, the patterned substrate including the first surface and the second surface having different normal directions, wherein the sacrificial layer includes a first portion disposed on the first surface and a second portion disposed on the second surface.

At step 1010, the method exposes the first surface by removing the first portion of the sacrificial layer disposed on the first surface. The first portion of the sacrificial layer may be removed by photolithography and etching as discussed above.

At step 1015, the method grows an original nitride buffer layer on the first surface and the second portion of the sacrificial layer.

At step 1020, the method partially lifts off the second portion of the sacrificial layer disposed on the second surface such that at least one sub-portion of the second portion of the sacrificial layer remains on the second surface of patterned substrate. In some embodiments, a top portion of the original nitride buffer layer is removed to expose a top portion of the second portion of the sacrificial layer. In some embodiments, a wet etching process uses a chemical that etches a material of the sacrificial layer but does not etch a nitride material of the original nitride buffer layer. The wet etching process etches away some sub-portions of the sacrificial layer underneath the portion of the original nitride buffer layer, such that the portion of the original nitride buffer layer is lifted off along with the sub-portions of the sacrificial layer that are lifted off.

At step 1025, the method grows an epitaxial layer on the original nitride buffer layer and a crystal surface of the epitaxial layer grows along a normal direction of the patterned substrate.

Figure 37:
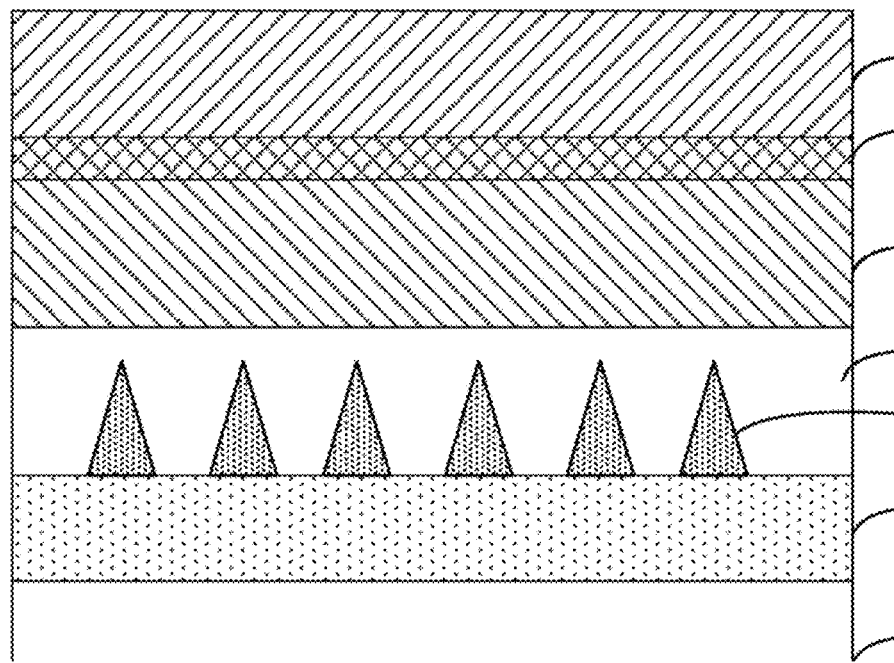
FIG. 37 schematically illustrates a semiconductor wafer according to one embodiment.

FIG. 37 schematically illustrates a semiconductor wafer according to one embodiment. The semiconductor wafer includes a substrate 1, a buffer layer 2, a sacrificial layer 3, a non-doped layer 4, a first semiconductor layer 5, a multiple quantum well layer 6, and a second semiconductor layer 7. The substrate 1 may be a graphical sapphire substrate or a sapphire plain film substrate. The buffer layer 2 is grown on a surface of the substrate 1.

The buffer layer may be an AlN buffer layer or a laminated layer of two or more types including AlGaN and AlN. The sacrificial layer 3 is grown on the buffer layer 2. The non-doped layer 4 is disposed on the sacrificial layer 3. The first semiconductor layer 5 is disposed on the non-doped layer 4. The multiple quantum well layer 6 is disposed on the first semiconductor layer 5. The second semiconductor layer 7 is disposed on the multiple quantum well layer 6.

Specifically, the sacrificial layer 3 may be a concave nano graph layer that partially covers the buffer layer 2. The sacrificial layer 3 may be a silicon dioxide layer. In one embodiment, in order to form the concave nano graph layer, a silicon dioxide thin film is grown first. Then, a template is provided for imprinting groove structure of the concave nano graph layer. Photoresist is formed on the silicon dioxide thin film, and the groove structure of the template is patterned to the photoresist. Further, the photoresist is solidified, and the template is removed.

Figure 38:
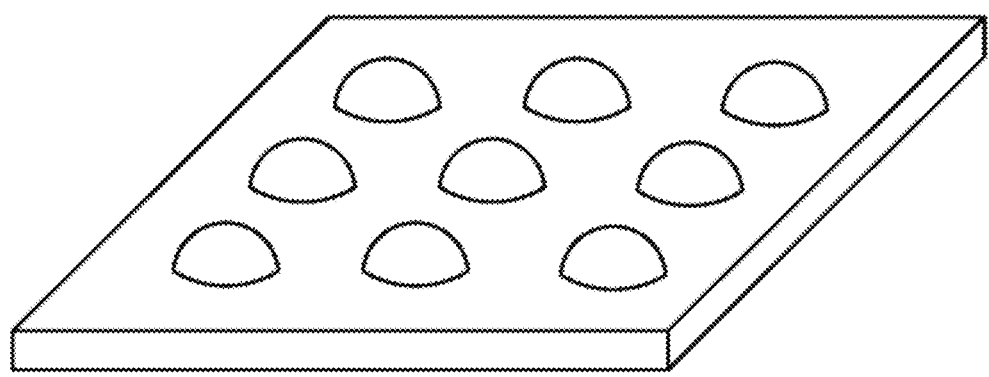
FIG. 38 illustrates an exemplary template including hemispherical grooves.
Figure 39:
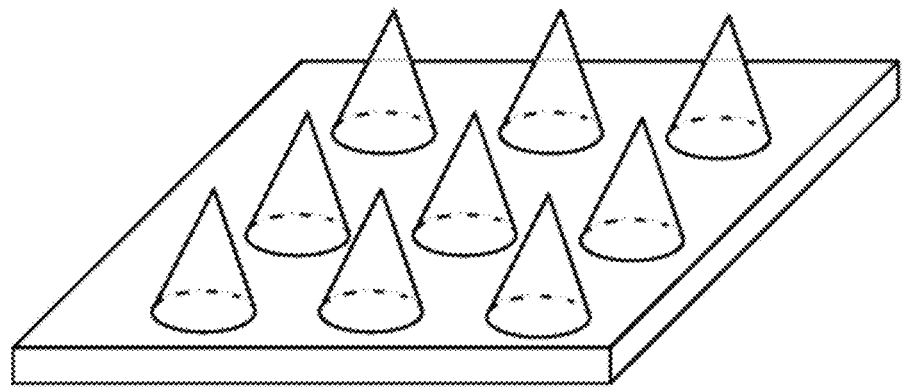
FIG. 39 illustrates an exemplary template including cone-shaped grooves.
Figure 40:
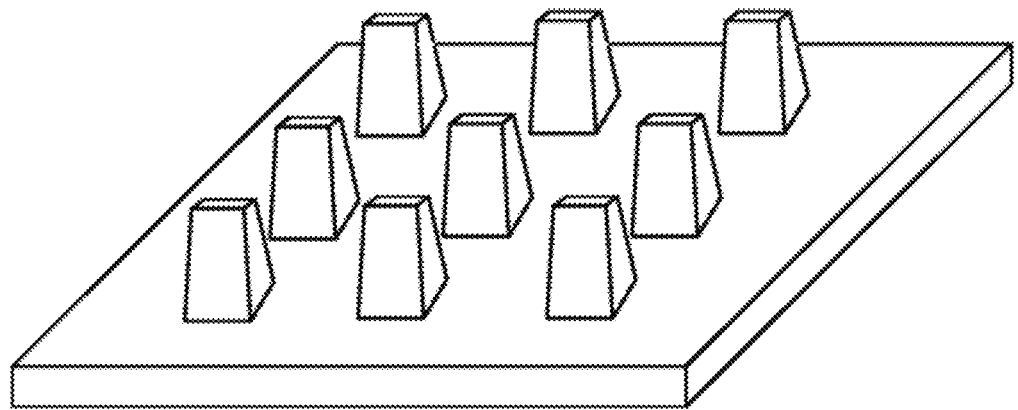
FIG. 40 illustrates an exemplary template including inverted trapezoidal grooves.

Specifically, the groove structure of the concave nano graph layer includes at least one of following grooves: a hemispherical groove (as shown in FIG. 38), a cone-shaped groove (as shown in FIG. 39), and an inverted trapezoidal groove (as shown in FIG. 40).

In some embodiments, the thickness of the concave nano graph layer is not greater than the thickness of the non-doped layer 4. Therefore, the grooves of the concave nano graph layer may not step out of the non-doped layer 4. The concave nano graph layer is formed by using nanometer embossing. And the surface density of the concave nano graph layer is within the range of $5*10^8$ cm$^{-2}$-$9*10^8$ cm$^{-2}$. Therefore, the use of the concave nano graph layer provides a refractive index different than the nitride buffer layer and the multiple quantum well layer, thereby improving the external quantum efficiency of LED by reducing total reflection.

In some embodiments, the width of the widest projection of the grooves on the buffer layer 2 is within the range of 180 nm-280 nm. For example, the diameter of the base of each cone-shaped groove of the concave nano graph layer is within the range of 180 nm-280 nm. Furthermore, the height of each groove is within the range of 50 nm-200 nm.

Figure 41:
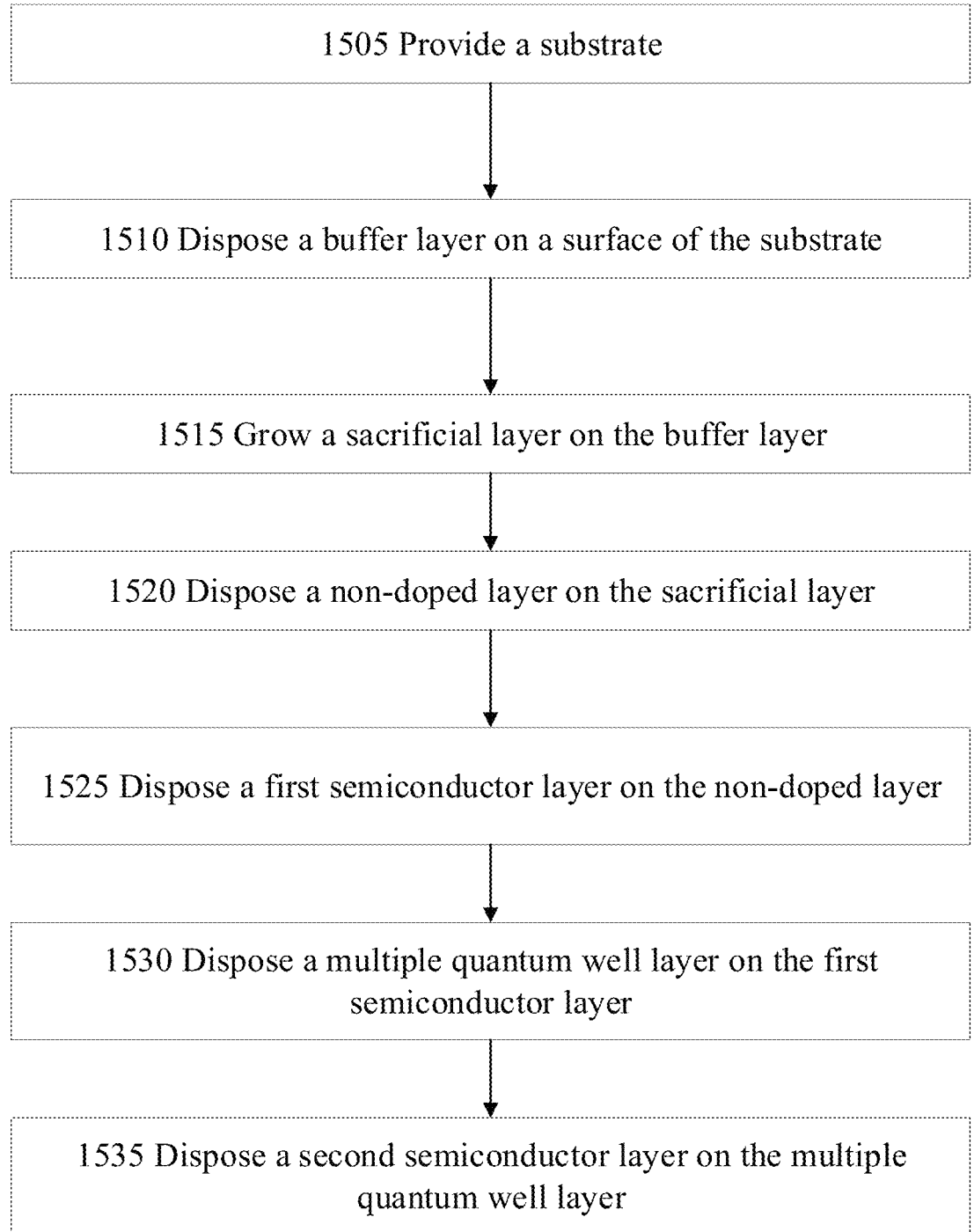
FIG. 41 illustrates a flow chart of a method for manufacturing a semiconductor wafer.

FIG. 41 illustrates a flow chart of a method for manufacturing a semiconductor wafer using a concave nano graph layer. At step 1505, the method providing a substrate. The substrate may be a graphical sapphire substrate or a sapphire plain film substrate.

At step 1510, the method grows a buffer layer on a surface of the substrate. The buffer layer may be an AlN buffer layer or a laminated layer of two or more types including AlGaN and AlN.

At step 1515, the method grows a sacrificial layer on the buffer layer. The sacrificial layer may be a concave nano graph layer that partially covers the buffer layer. The sacrificial layer may be a silicon dioxide layer. In one embodiment, in order to form the concave nano graph layer, a silicon dioxide thin film is grown first. Then, a template is provided for imprinting groove structure of the concave nano graph layer. Photoresist is formed on the silicon dioxide thin film, and the groove structure of the template is patterned to the photoresist. Further, the photoresist is solidified, and the template is removed.

Specifically, the groove structure of the concave nano graph layer includes at least one of following grooves: a hemispherical groove (as shown in FIG. 38), a cone-shaped groove (as shown in FIG. 39), and an inverted trapezoidal groove (as shown in FIG. 40).

In some embodiments, the thickness of the concave nano graph layer is not greater than the thickness of the non-doped layer 4. Therefore, the grooves of the concave nano graph layer may not step out of the non-doped layer 4. The concave nano graph layer is formed by using nanometer embossing. And the surface density of the concave nano graph layer is within the range of $5*10^8$ cm$^{-2}$-$9*10^8$ cm$^{-2}$.

In some embodiments, the width of the widest projection of the grooves on the buffer layer 2 is within the range of 180 nm-280 nm. For example, the diameter of the base of each cone-shaped groove of the concave nano graph layer is within the range of 180 nm-280 nm. Furthermore, the height of each groove is within the range of 50 nm-200 nm.

Additionally, at step 1520, the method disposes a non-doped layer on the sacrificial layer.

At step 1525, the method disposes a first semiconductor layer on the non-doped layer.

At step 1530, the method disposes a multiple quantum well layer on the first semiconductor layer.

At step 1535, the method disposes a second semiconductor layer on the multiple quantum well layer.

As used herein, the singular terms "a," "an," and "the" may include plural referents unless the context clearly dictates otherwise.

Spatial descriptions, such as "overlying" "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor wafer, comprising:
   a patterned substrate comprising at least a first surface and a second surface having different normal directions;
   at least one sub-portion of a sacrificial layer grown on the second surface of the patterned substrate;
   a nitride buffer layer selectively-grown on the first surface of the patterned substrate; and
   an epitaxial layer grown on the nitride buffer layer and the at least one sub-portion of the sacrificial layer, wherein a crystal surface of the epitaxial layer grows along a normal direction of the patterned substrate.

2. The semiconductor wafer of claim 1, wherein the at least one sub-portion of the sacrificial layer is obtained by performing steps comprising:
   disposing the sacrificial layer on the first surface and the second surface of the patterned substrate, wherein the sacrificial layer comprises a first portion disposed on the first surface and a second portion disposed on the second surface;
   exposing the first surface by removing the first portion of the sacrificial layer disposed on the first surface;
   growing the nitride buffer layer on the first surface and the second portion of the sacrificial layer; and
   partially lifting off the second portion of the sacrificial layer disposed on the second surface such that the at least one sub-portion of the second portion of the sacrificial layer remains on the second surface of the patterned substrate.

3. The semiconductor wafer of claim 1, wherein the sacrificial layer comprises two or more sub-layers.

4. The semiconductor wafer of claim 3, wherein each sub-layer of the sacrificial layer comprises one of followings: silicon dioxide, magnesium fluoride, magnesium oxide, silicon nitride, and indium tin oxide (ITO).

5. The semiconductor wafer of claim 1, wherein the sacrificial layer comprises a first sub-layer and a second sub-layer, and said disposing the sacrificial layer on the first surface and the second surface of the patterned substrate further comprises:
   disposing the first sub-layer on the patterned substrate, wherein the first sub-layer comprises a first portion disposed on the first surface and a second portion disposed on the second surface; and
   disposing the second sub-layer on the first sub-layer, wherein the second sub-layer comprises a first portion disposed on the first portion of the first sub-layer and a second portion disposed on the second portion of the first sub-layer;
   and wherein said partially lifting off the second portion of the sacrificial layer disposed on the second surface such that the at least one sub-portion of the second portion of the sacrificial layer remains on the second surface of the patterned substrate comprises:
   lifting off the second portion of the second sub-layer such that the second portion of the first sub-layer remains on the second surface of the patterned substrate.

6. The semiconductor wafer of claim 5, wherein said lifting off the second portion of the second sub-layer comprises lifting off the second portion of the second sub-layer by an etching process using a chemical that etches away a material of the second sub-layer but does not etch away a nitride material of the original nitride buffer layer and a material of the first sub-layer.

* * * * *